(12) United States Patent
Hiradate et al.

(10) Patent No.: US 7,924,366 B2
(45) Date of Patent: Apr. 12, 2011

(54) IMAGE DISPLAYING APPARATUS

(75) Inventors: Mika Hiradate, Yokohama (JP); Hidemi Yamada, Yokohama (JP); Nobuyuki Kaku, Oiso (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/792,131

(22) Filed: Jun. 2, 2010

(65) Prior Publication Data

US 2010/0238372 A1 Sep. 23, 2010

Related U.S. Application Data

(63) Continuation of application No. 12/164,215, filed on Jun. 30, 2008, now Pat. No. 7,796,206.

(30) Foreign Application Priority Data

Sep. 28, 2007 (JP) ................................. 2007-255752
Sep. 28, 2007 (JP) ................................. 2007-255769

(51) Int. Cl.
*G02F 1/1333* (2006.01)
(52) U.S. Cl. ........................................... 349/58; 349/60
(58) Field of Classification Search ..................... 349/58, 349/60
See application file for complete search history.

(56) References Cited

U.S. PATENT DOCUMENTS

| | | | |
|---|---|---|---|
| 5,479,285 A | 12/1995 | Burke | |
| 5,836,676 A | 11/1998 | Ando et al. | |
| 6,067,133 A * | 5/2000 | Niibori et al. | 349/60 |
| 7,453,528 B2 * | 11/2008 | Kim et al. | 349/1 |
| 2004/0263505 A1 | 12/2004 | Tsubokura | |
| 2005/0094052 A1 | 5/2005 | Sakurai et al. | |
| 2005/0117086 A1 | 6/2005 | Sugahara | |
| 2005/0248694 A1 | 11/2005 | Nakayama | |
| 2006/0044746 A1 | 3/2006 | Kim et al. | |
| 2006/0077147 A1 | 4/2006 | Palmateer | |
| 2006/0077629 A1 | 4/2006 | Shiraishi | |
| 2006/0133017 A1 | 6/2006 | Bang | |
| 2006/0146505 A1 | 7/2006 | Kim et al. | |
| 2006/0198089 A1 | 9/2006 | Cho | |

(Continued)

FOREIGN PATENT DOCUMENTS

EP 1803988 A2 7/2007

(Continued)

OTHER PUBLICATIONS

European Search report and Examination Report in EP08251889.5-2214/2043415; mailed Nov. 25, 2010, (10 pgs.).

*Primary Examiner* — Hemang Sanghavi
(74) *Attorney, Agent, or Firm* — Antonelli, Terry, Stout & Kraus, LLP.

(57) ABSTRACT

A display apparatus is provided which includes a display panel, a signal board for processing an image signal used in an image display, and a power source board for supplying power from a power source to the signal board and the display panel. The signal board and the power source board are disposed in a horizontal direction relative to the display panel, and a projection portion, being disposed higher above a surface of the power source board than a circuit element of the power source board and not being connected with a member opposing to a mounting side of the circuit element, is provided on the surface of the power source board where the circuit element is mounted.

10 Claims, 7 Drawing Sheets

U.S. PATENT DOCUMENTS

| | | |
|---|---|---|
| 2006/0207434 A1 | 9/2006 | Takeda |
| 2007/0002590 A1 | 1/2007 | Jang et al. |
| 2007/0046852 A1 | 3/2007 | Kim et al. |
| 2007/0216702 A1 | 9/2007 | Takahashi et al. |
| 2009/0145637 A1* | 6/2009 | Kanouda et al. ............... 174/255 |

FOREIGN PATENT DOCUMENTS

| | | |
|---|---|---|
| JP | 05-81874 | 11/1993 |
| JP | 07-083260 | 3/1995 |
| JP | 09-297543 | 11/1997 |
| JP | 09-297560 | 11/1997 |
| JP | 10-172445 | 6/1998 |
| JP | 11-109879 | 4/1999 |
| JP | 2000-089682 | 3/2000 |
| JP | 2000-171821 | 6/2000 |
| JP | 2001-022280 | 1/2001 |
| JP | 2001-022281 | 1/2001 |
| JP | 2001-100650 | 4/2001 |
| JP | 2001-188222 | 7/2001 |
| JP | 2001-337611 | 12/2001 |
| JP | 2002-090736 | 3/2002 |
| JP | 2004-021104 | 1/2004 |
| JP | 2004-078107 | 3/2004 |
| JP | 2004-151305 | 5/2004 |
| JP | 2005-17791 | 1/2005 |
| JP | 2005 045703 | 2/2005 |
| JP | 2005-115335 | 4/2005 |
| JP | 2005-283505 | 10/2005 |
| JP | 2005-284106 | 10/2005 |
| JP | 2005-346932 | 12/2005 |
| JP | 2006-065119 | 3/2006 |
| JP | 2006-146169 | 6/2006 |
| JP | 2006-162641 | 6/2006 |
| JP | 2006-171766 | 6/2006 |
| JP | 2007-011361 | 1/2007 |
| JP | 2007-058180 | 3/2007 |
| JP | 2007-065302 | 3/2007 |
| JP | 2007-159048 | 6/2007 |

* cited by examiner

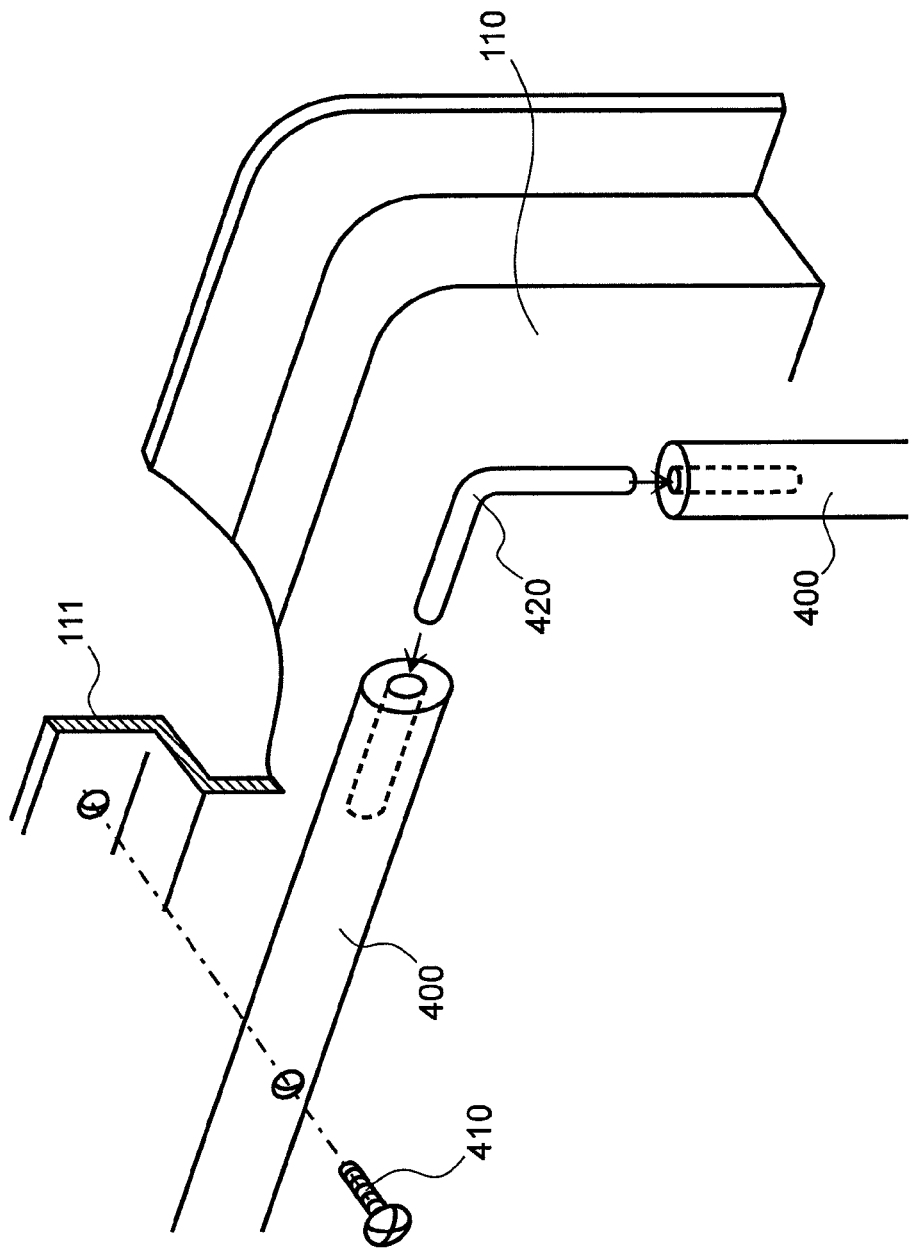

IMAGE DISPLAYING APPARATUS

CROSS REFERENCE TO RELATED APPLICATION

This application is a continuation of U.S. application Ser. No. 12/164,215, filed Jun. 30, 2008, the contents of which are incorporated herein by reference.

BACKGROUND OF THE INVENTION

The present invention relates to a large-size image displaying apparatus applying therein, such as, a liquid crystal display (LCD) or a plasma display (PDL), for example, and it relates, in particular, to supporting structures of a panel module for building up the large-size image displaying apparatus.

In recent years, accompanying with digitalizing and/or high definition of the television broadcasting, a demand is made for a large-size and thin-type image displaying apparatus for receiving the television broadcasting on the air, i.e., a television receiver, and as such the image displaying apparatus for satisfying such demand, as well as, the conventional projection-type displaying apparatus, those also appear widely on the market, adapting the liquid crystal display (LCD) and the plasma display (PDL) therein. And, including the structures of external appearance of the apparatus of, such the large-size and thin-type image displaying apparatus, various supporting structures are already known, in the following Patent Documents 1 to 5:

[Patent Document 1] Japanese Patent Laying-Open No. 2007-159048 (2007);

[Patent Document 2] Japanese Patent Laying-Open No. 2004-151305 (2004);

[Patent Document 3] Japanese Patent Laying-Open No. 2004-21104 (2004);

[Patent Document 4] Japanese Patent Laying-Open No. 2001-100650 (2001); and

[Patent Document 5] Japanese Patent Laying-Open No. Hei 11-109879 (2007).

BRIEF SUMMARY OF THE INVENTION

In general, within the structures of such the image displaying apparatus of large-size and thin-type, in particular, within the image displaying apparatus adapting the liquid crystal display (LCD) therein, as the displaying device, for example, there are prepared a panel module, installing a large-size liquid display (LCD), including a reflection plate and/or a back light device therein, as a unit, and also a housing having a predetermined configuration (including a frame and a rear plate), and then within the said housing are installed a power source board or substrate, for supplying a desired electric power to that apparatus, and also a driver circuit board for driving the display device upon basis of various kinds of input signals (video signals), etc.

By the way, in such the large-size and thin-type image displaying apparatus as was mentioned above, by taking a design property thereof, etc., into the consideration thereof, such a structure is widely adapted, that the power source board and/or the driver circuit board, etc., mentioned above, are attached on a rear side surface of the panel module, as is shown in the above-mentioned Patent Documents 1 to 4, etc. In addition thereto, in recent years, accompanying further large-sizing of the screen size, also the panel module comes to be large in the area thereof.

Such the panel module is, in general, made from a metal plate, such as, aluminum, etc., as a reflection plate of a light, and is constructed while disposing a back-light device (e.g., thin fluorescent light lamps) within a frame (e.g., on a bottom portion), which is formed in a box-like shape with thin thickness, a liquid crystal display (LCD) is fixed on a surface thereof. However, accompanying with such large-sizing in the area of the panel module as mentioned above, it is necessary to ensure or maintain mechanical strength of the panel module, and for example, as is disclosed in the Patent Document 5 mentioned above, there is proposed a structure of providing a supporting member, having such a configuration that it extends along with diagonal lines drawn by connecting four (4) corners on the rear side surface of the flat panel, i.e., an "X"-like shape.

However, such the conventional arts as was mentioned above, in particular, the structures of providing such the "X"-like shaped supporting member, as is shown in the Patent Document 5 mentioned above, brings about a problem within thin-sizing of the image displaying apparatus, and therefore, it cannot to be said that, necessarily, it is the supporting structures suitable for the practical use.

Then, according to the present invention, being accomplished by taking such the drawback(s) within the conventional arts mentioned above into the consideration thereof, and in particular, an object thereof is to provided an image displaying apparatus and also supporting structures thereof, being suitable for thin-sizing of the apparatus, as well as, for dissolving the problems accompanying an increase of area of the panel module due to the large-sizing of the image displaying apparatus, including the structures for attaching the power source board and the driver circuit board, etc., on the rear surface of the panel module.

For accomplishing such the object as mentioned above, according to the present invention, there is provided an image displaying apparatus, comprising: a large-size housing; and a panel module, having a thin plate-like frame having a rectangular shape in an outer configuration thereof, and a display element, which is mounted on said frame, and being attached on said housing, wherein on a flange portion, which is formed along with an outer periphery of said thin plate-like frame building up said panel module, is further formed a reinforcement portion.

Further, according to the present invention, within the image displaying apparatus as described in above, it is preferable that said reinforcement portion is made by bending the flange portion on the outer periphery of said frame into a predetermined cross-section configuration, through a squeezing process, and in that instance, it is further preferable that the flange portion on the outer periphery of said frame is formed into about a "U"-shape, or about a circular or semi-circular shape, or about a triangle shape, in the cross-section configuration thereof, through the squeezing process.

Also, according to the present invention, within the image displaying apparatus as described in the above, it is also possible, that said reinforcement portion is made up with cylindrical members, being fixed along the outer periphery of said frame, and "L"-shaped members, each being fixed between the cylindrical members neighboring with each other, or a stand portion of said apparatus is attached with, by using said reinforce portion.

With such the present invention as was mentioned above, while dissolving the problems accompanying with an increase of the area of panel module due to the large-sizing of the image displaying apparatus, there can be achieved superior effects, i.e., enabling to manufacture a panel module, being superior in the mechanical strength thereof, easily and cheaply, and thereby providing an image displaying apparatus suitable for the large-sizing and/or thin-sizing of the apparatus.

Further, according to the present invention, there is also provided the image displaying apparatus as described in the above, further comprising: a plural number of supporting members, each being attached between a pair of the reinforcement portions, which are formed along the outer periphery of said thin plate-like frame, and a circuit board necessary for said displaying apparatus, being attached on a reverse surface side of said panel module by using said plural number of the supporting members.

Also, according to the present invention, within the image displaying apparatus, as is described in the above, said plural number of the supporting members are disposed in vertical direction, and between of which is attached said circuit board, preferably, and further on the reverse surface side of said panel module may be provided a rear cover for covering over said panel module that is attached with said circuit board thereon, and in upper and lower portions of said rear cover are formed opening portions for taking a cooling air into an inside thereof. Or, a stand portion of said apparatus may be made up with using a part of said plural numbers of supporting members.

Further, according to the present invention, within the image displaying apparatus as described in the above, it is preferable that said circuit board includes a member for defining a predetermined gap between the frame building up said panel module, in a part thereof, and in that case, said circuit board mounts thereon a power source circuit for supplying electric power to said apparatus, and said board is made of an insulated board. Or, said plural numbers of supporting members may be made of a conductive material, and in a part of which is formed a grounding portion for electrically grounding the frame building up said panel module.

As was mentioned above, with such the present invention as was mentioned above, while dissolving the problems accompanying with an increase of the area of panel module due to the large-sizing of the image displaying apparatus, there can be achieved superior effects, i.e., enabling to provide the supporting structures of the image displaying apparatus, being suitable for the thin-sizing of the apparatus, including the structures for attaching the power source board and the driver circuit board, etc., on the reverse surface of the said panel module.

BRIEF DESCRIPTION OF THE SEVERAL VIEWS OF THE DRAWING

Those and other objects, features and advantages of the present invention will become more readily apparent from the following detailed description when taken in conjunction with the accompanying drawings wherein:

FIG. 4 is a view of showing the structures, for maintaining the mechanical strength within the above-mentioned panel module, in particular, being suitable for the large-size image displaying apparatus;

DETAILED DESCRIPTION OF THE PREFERRED EMBODIMENTS

Hereinafter, embodiments according to the present invention will be fully explained by referring to the attached drawings. However, the present embodiment relates an image displaying apparatus applying a liquid crystal display (LCD) therein, and hereinafter, explanation will be made on the image displaying apparatus applying this liquid crystal display therein, together with supporting structures thereof.

Figure 1:
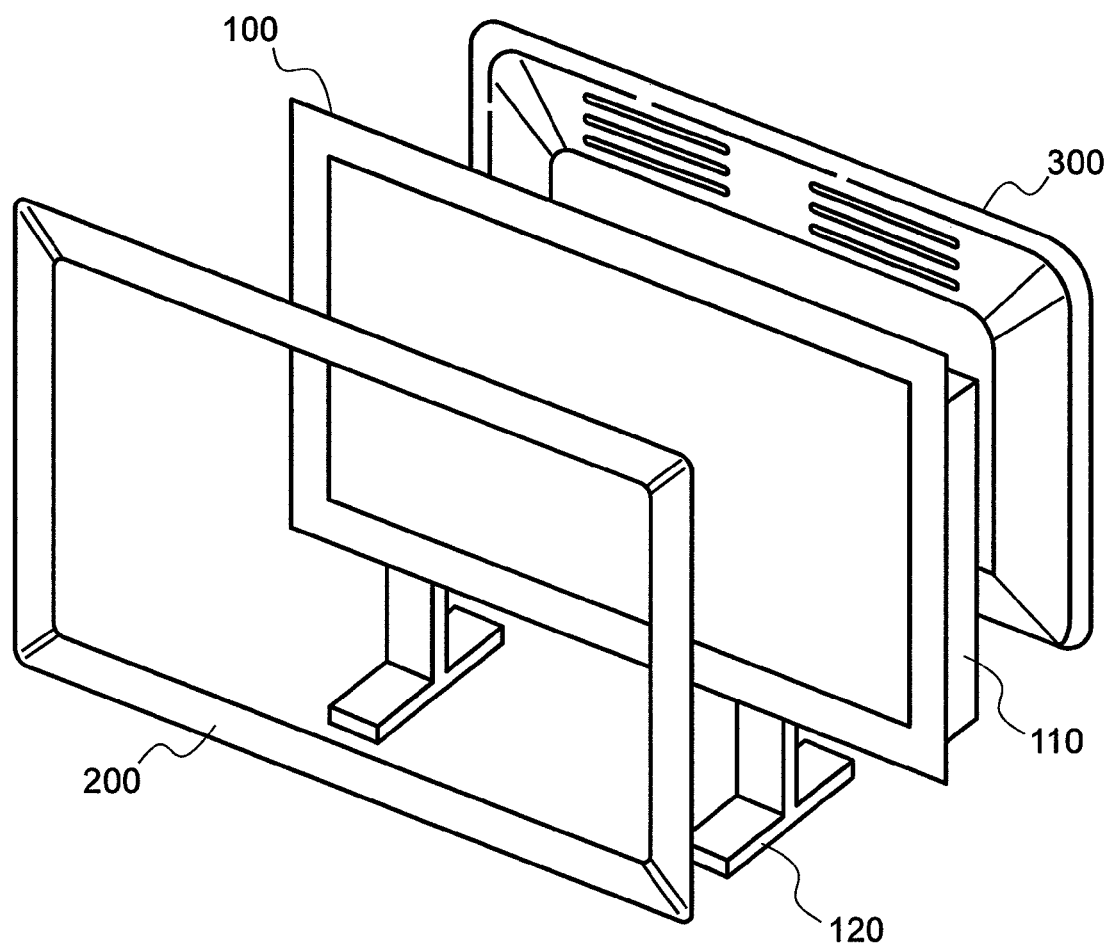
FIG. 1 is a perspective view for showing the entire structures of an image displaying apparatus, according to an embodiment of the present invention.

First of all, FIG. 1 attached herewith shows the entire structures of the image displaying apparatus, according to the present invention, in the expansion manner thereof, and in this figure, a reference numeral 100 depicts a liquid crystal display (LCD), as the large-size image displaying apparatus. Further, normally, this liquid crystal display (LCD) is attached on an opening side of a frame 110, being made from a thin aluminum plate, for example, which is formed into a box-like shape having an about "U"-like cross-section, and being shallow up to the bottom thereof and having a large area, and thereinafter it is called a "panel module". However, on the bottom surface of this frame 110 are disposed or aligned, for example, a plural number of fluorescence tubes or a fluorescence body, such as, light-emitting diodes, etc., for obtaining a desired brightness by irradiating a light on the thin plate-like liquid crystal panel (LCD) having a rectangular external configuration from the rear surface thereof (i.e., a backlight). Further, on the rear of this panel module are attached boards or substrates, etc., necessary for the apparatus, for example, a signal board and/or a power source board, etc., the details of which will be explained later, and on a lower side thereof is attached a stand (i.e., a leg) for setting up that apparatus.

And, on the surface of the panel module 100 mentioned above is attached, normally, an exterior frame 200, being called "bezel", which is formed through an injection molding of synthetic resin, etc., while on the rear side of that module is also attached a rear cover 300, which is also formed through the injection molding of synthetic resin, etc.

Figure 2:
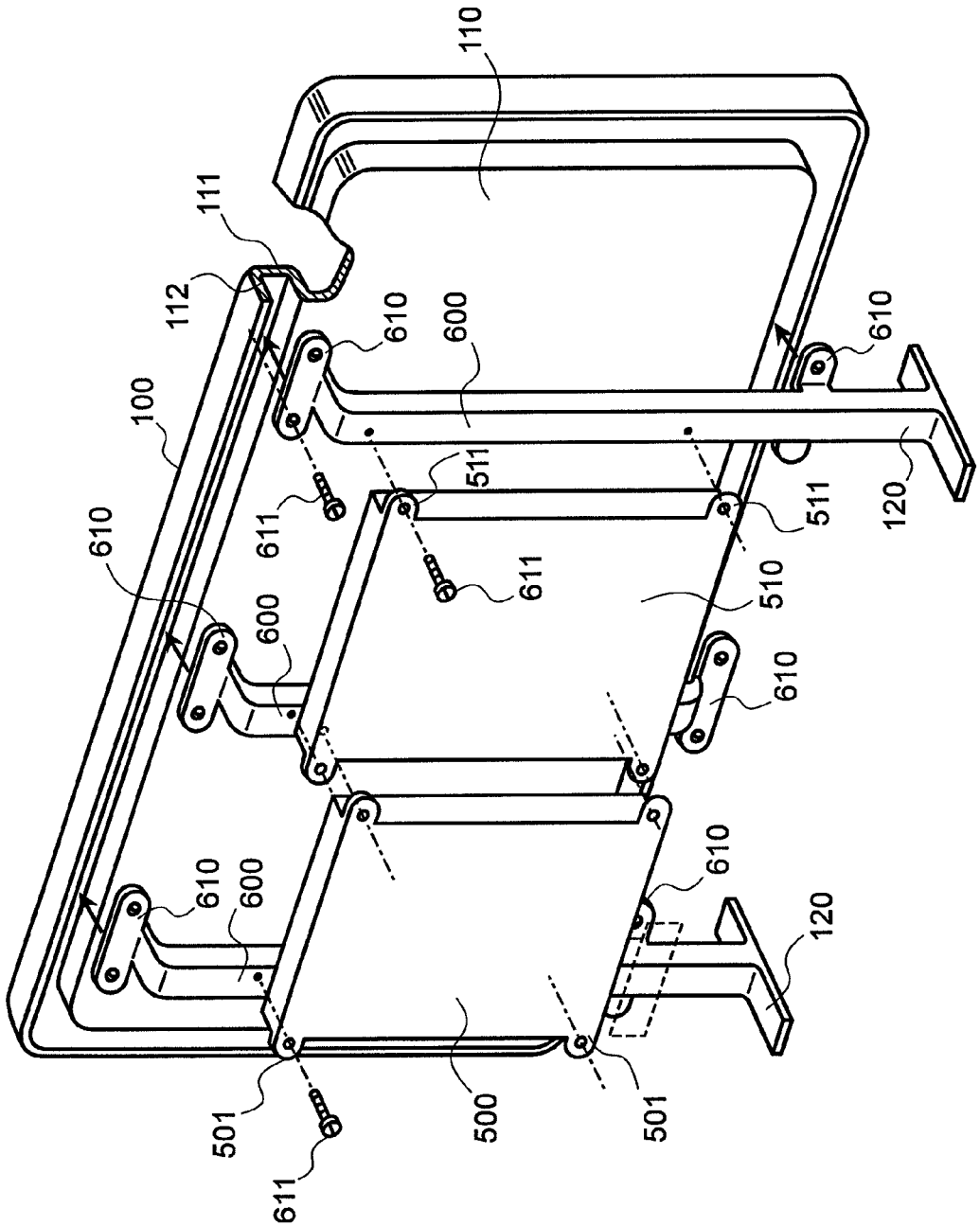
FIG. 2 is a perspective view for showing only a panel module, which is taken out from the image displaying apparatus, seeing it from a rear side surface thereof.
Figure 3A:
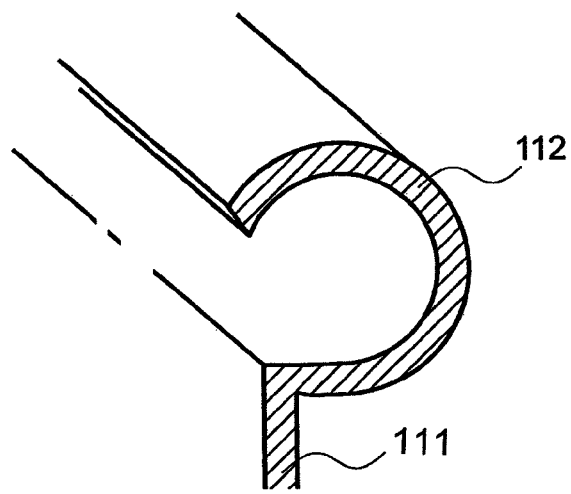
FIGS. 3(a) and 3(b) are views for showing other examples of the structures for ensuring or maintaining mechanical strength within the panel module mentioned above.
Figure 3B:
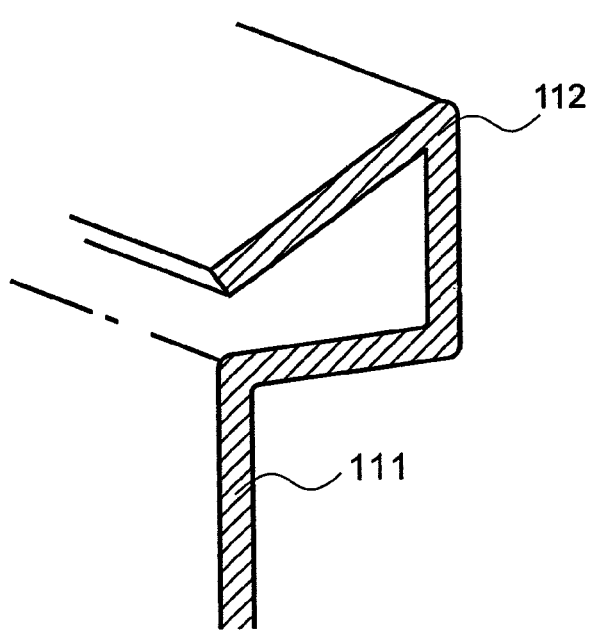

Next, FIG. 2 attached herewith shows a perspective view of the panel module 100, within the image displaying apparatus mentioned above, in particular, when only taking it out therefrom and seeing it from the rear side thereof. And, according to the embodiment of the present invention, as was explained in the above, in particular, for the purpose of dissolving the problem accompanying with an increase of an area of the panel module due to the large-sizing of the image display apparatus, i.e., for ensuring or maintaining the mechanical strength of the panel module, a part (e.g., an outer side) of a flange portion 111 formed along an outer periphery of the frame 110, supporting that panel module 100 from the rear surface thereof, is further bent through a drawing or squeezing process so as to have a reinforcement portion 112, for example, into "U"-like shape in the cross-section thereof, as is shown in a partial cross-section thereof. Thus, with provision of the frame-like reinforcement portion 112, which is formed in the flange portion 111 the on an outer periphery of this frame 110 through the drawing or squeezing process, it is possible to maintain the mechanical strength thereof, simply or easily, without using an additional reinforcement member, within that panel module 100 after attaching the liquid crystal display (LCD) onto the frame 110. However, such the structures for maintaining the mechanical strength of the panel module is advantageous for reducing the manufacturing cost, and it is advantageous, in particular, for the image displaying apparatus having the size less than 50 inches. Further, the configuration of bending the part (e.g., the outer side) of flange portion 111, which is formed along the outer periphery of the frame 110 should not be restricted only to the "U"-like shape mentioned above, and it may be in the configuration, for example, a semi-circular (see FIG. 3(a)) or a triangle (see FIG. 3(b)), in the cross-section thereof.

However, according to the present invention, the reinforcement structures for maintaining the mechanical strength of the panel module 100 should not be restricted only to the structures mentioned above, i.e., the reinforcement portion 112 of the "U"-like cross-section shape, which is formed on the outer periphery of the frame 110 through the drawing or squeezing process; but other than that, it is enough to be able to maintain the mechanical strength thereof, on the outer periphery of the frame 110 mentioned above (i.e., a frame-like reinforcement structure for the frame), and for example, as is shown in FIG. 4, it is also possible to adapt the following structures; i.e., while preparing metal pipes 400, in advance, having plural lengths corresponding to outer peripheral sizes of the frame 110 (the vertical and the horizontal sizes), the plural number of those metal pipes 400 are fixed onto the flange portions 111, by means of screws 410, etc., for example, and further the metal pipes 400 are fixed by means of a member 420, being "L"-like shaped in the outer configuration thereof, at each of the corners thereof. Moreover, such structure mentioned above is superior to the structure mentioned before, as the reinforcement structure for maintaining the mechanical strength of the panel module 100, and is advantageous, as the reinforcement structures for the image displaying apparatus of size, being equal to 50 inches or greater than that, i.e., an apparatus having relatively large size.

Following to the above, turning back to FIG. 2 mentioned above, again, with using the reinforcement portion 112 formed on the flange portion 111, on the outer periphery of the frame 110, e.g., the reinforcement structure of the panel module 100 mentioned above, explanation will be given on the structures for attaching various kinds of circuit boards or substrates on the rear surface side thereof, such as, including a signal board 500 for inputting and conducting predetermined signal processing upon the video signals, as an input signal of that apparatus, and further a power source board 510 for supplying various kinds of voltage supplies necessary for video displaying and/or driving, to be supplied to each part of the panel module 100 mentioned above.

Thus, as is apparent from FIG. 2 mentioned above, on the rear surface side of the panel module 100 mentioned above, surrounding the central portion thereof are attached plural numbers (in this example, three (3) pieces in total) of supporting members 600, 600 . . . , for example, each being obtained by forming a metal plate into a predetermined configuration (in this example, "U"-like shape in the cross-section thereof), with using the reinforcement portion 112, which is formed on the flange 111, on the outer periphery of the frame 110, directing into the vertical direction (i.e., crossing a pair of reinforcement portions opposing to each other, which are formed on the outer periphery of the flange portion). However, in the example shown in this figure, two (2) pieces of the supporting members 600 and 600, on both ends thereof, further extend below, so as to form a stand 120 of the apparatus. And, each of the supporting members 600 is formed with fixing portions 610 and 610, at upper and lower positions (2 positions) corresponding to the reinforcement portions 112, which are formed on the flange 111, on the outer periphery of the frame 110, in the longitudinal direction thereof (i.e., the vertical direction in the figure), to be fitted or inserted into gutters or grooves, which are formed in "U"-like shape in the cross-section thereof, and thereby to be fixed by means of screws 611 or the like.

With such the supporting members 600 mentioned above, the fixing portions 610 and 610, which are formed at the upper and lower positions (2 positions) thereof, are fixed to the reinforcement portions 112 (i.e., the flange portions 111, with which are formed the frame-like reinforcement portions), being the reinforcement structures for maintaining the mechanical strength of the panel module 100, but not attached directly on the rear surface of the frame 110. Thus, the fact that it is not fixed onto the panel module 100 brings about the structures of bearing no load upon that panel module 100. However, in the above is shown an example, wherein the two (2) pieces of the supporting members 600 and 600 at to the both ends thereof extend below, thereby to make up the stand 120 of the apparatus, and in such case, also, the load from that stand 120 can be avoided from being applied on that panel module 100, directly, in particular, then it is advantageous. However, the present invention should not be restricted only to this, and the two (2) pieces of the supporting members 600 and 600 at the both ends thereof may have the same structure of the supporting member 600 at the center thereof. However, in such case, it would be preferable that, for example, the stand 120 mentioned above is fixed at a central power of the lower side of the panel module 100, with using the reinforcement portion 112, which is formed on the lower side thereof.

And, the signal board 500 mentioned above, and further the power source board 510, etc., can be attached, within a narrow space remaining on the rear surface side of that panel module 100, with utilizing those plural pieces of the supporting members 600, 600 . . . , with high efficiency. Thus, as is shown the figure, the signal board 500 and the power source board 510 are attached on the supporting members 600, 600 . . . , respectively, with using holder portions 501 and 511, which are formed in part of that module (in the present example, at corner parts), by means of screws 611, etc., in the similar manner to the above, for example. However, herein, as is shown by broken lines in the figure, it would be preferable to provide so-called a terminal board or substrate, having a plural number of terminals for connecting that apparatus to an external equipment, to be separated from the signal board 500 mentioned above, as other unit (for example, a lower portion of the signal board 500), since it can be attached or removed, easily, dependent upon changes of the destination of that product, etc.

Figure 5A:
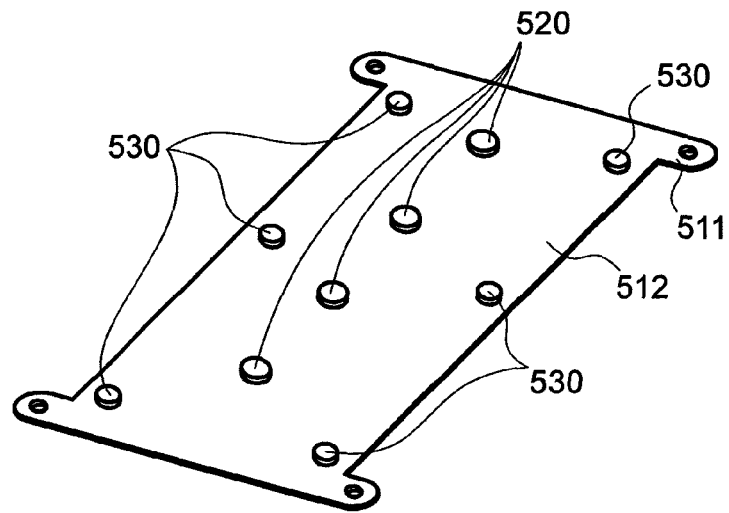
FIGS. 5(a) to 5(c) are views for showing the detailed structures of a power source board, which is attached on the reverse surface of the panel module, within the above-mentioned panel module.
Figure 5B:
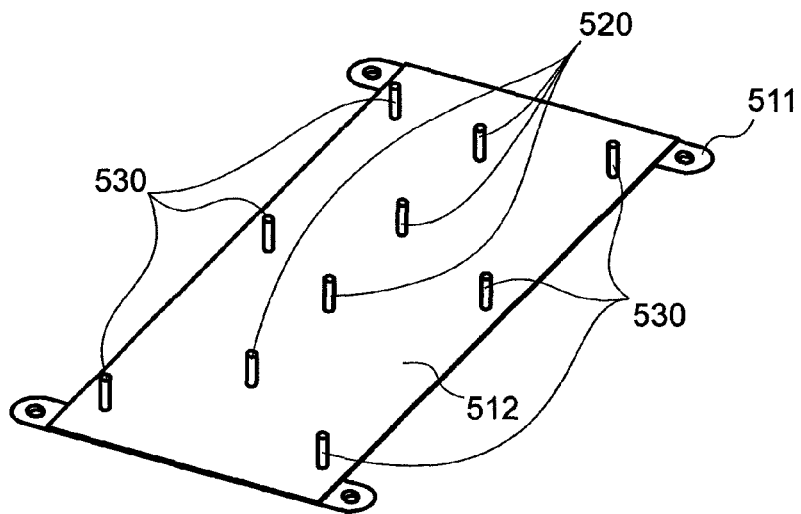
Figure 5C:
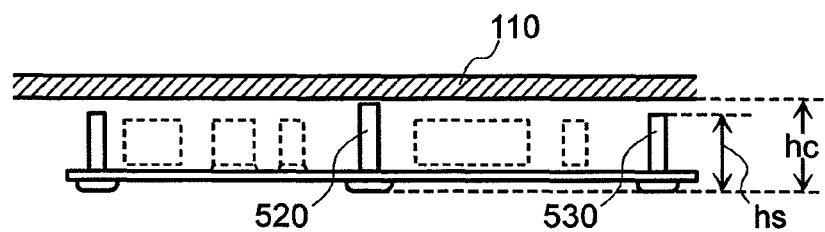

Also, FIGS. 5(a) to 5(c) attached herewith show the structures suitable for the signal board 500 and the power source board 510, to be attached with using the plural number of the supporting members 600, 600 . . . , and in particular, the latter thereof, the power source board 510. However, an insulated substrate 512 building up this power source board 510 is formed with using an insulating paper or plate having flexibility, such as, NOMEX film or paper (®) produced by DuPont Corp., etc., for example, by cutting it out into about a rectangular shape in the outer configuration (see FIGS. 5(a) and 5(b)). And, as is shown in FIG. 5(a), a plural number of flat head pins 520 and 530, each having an outer configuration of about "T"-like, are driven (or attached) at predetermined positions, respectively, from the surface thereof, so that, as is shown in FIG. 5(b), the flat head pin 520 at the central portion and those 530 on both sides thereof project the tips thereof on the reverse side of the insulated substrate 512, penetrating the tips thereof through the substrate 512, and thereby they are used as spacers for maintaining a predetermined gap between the reverse surface of the frame 110. However, the projection heights of the flat head pins are so determined, the height "hc" of the flat head pin 520 at the central portion thereof is a little bit larger than the height "hs" (hc>hs) of the flat head pins 530 on both sides thereof.

On the insulated substrate 512 of the power source board 510, which is built up in the manner mentioned above, are formed elements (shown by broken lines in FIG. 5(c)), building up power source circuits for supplying various kinds of voltage sources, on the reverse surface shown in FIG. 5(b). And, that power source board 510 is disposed in a narrow space remaining on the reverse surface side of the panel module 100, with using the insulated substrate 512 and the supporting members 600, 600 . . . . In that instance, as is shown in FIG. 5(c), the insulated substrate 512 (in particular, the elements shown by the broken lines, which are provided on the reverse surface thereof), is disposed at the position, separating from the reverse surface of the frame 110 of the panel module 100 by a predetermined distance, in particular, due to the function of the flat head pin 520 at the central portion, and further, in that instance, even if the insulated substrate 512 is suppressed and bent by a force applied from an outside, it can be still maintained at that position separating from the reverse surface of the frame 110 by the predetermined distance, due to the functions of the flat head pins 530 on both sides thereof.

Thus, with the insulated substrate 512 having the flat head pins 520 and 530 mentioned above, it is possible to maintain the predetermined distance necessary, between the elements building up those power source circuits and the frame 110, with certainty (i.e., preventing the elements from contacting on the frame). For that reason, such the structures can be preferably applied, in particular, as the insulated substrate within the power source board 510, having a possibility of generating an accident due to contacting of the panel module with the frame.

In addition thereto, explanation will be given on variation of the supporting members 600, 600 . . . , which are provided in the reverse surface side of the panel module 100, in particular, upon the structures being suitable for grounding the frame 110 of the panel module mentioned above, by referring to FIGS. 6(a) and 6(b) attached herewith. However, this is due to a viewpoint that, it is desirable to keep the grounding positions in plural numbers thereof, between the panel module and the frame 110, for the purpose of maintaining further preferable performances, accompanying with an increase of the area of the panel module due to large-sizing of the image displaying apparatus.

Figure 6A:
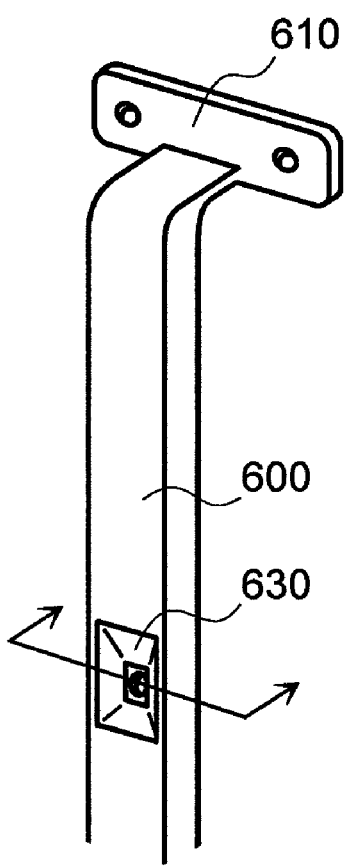
FIGS. 6(a) and 6(b) are views for showing variations of a supporting member, which is attached on the reverse surface of the panel module mentioned above.
Figure 6B:
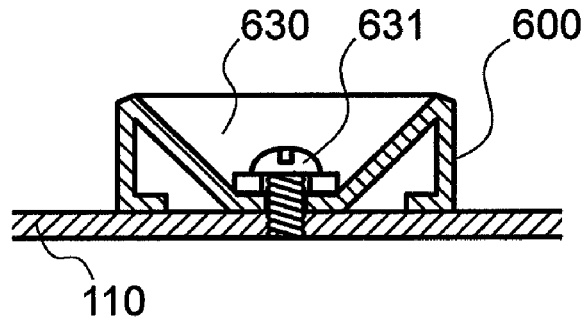

Thus, as is shown in FIG. 6(a), at desired position(s) on the way of the supporting member 600 mentioned above is/are formed hollow portion(s), as shown in FIG. 6(b), in advance, and after attaching that supporting member 600 on the reverse surface side of the frame 110 of the panel module, a screw 631 made of conductive material, such as, a metal, etc., is also attached thereon, so as to bring about a conductive condition between that supporting member and the frame, and thereby ensuring the grounding condition to be preferable all over the entire of the panel module.

Figure 7:
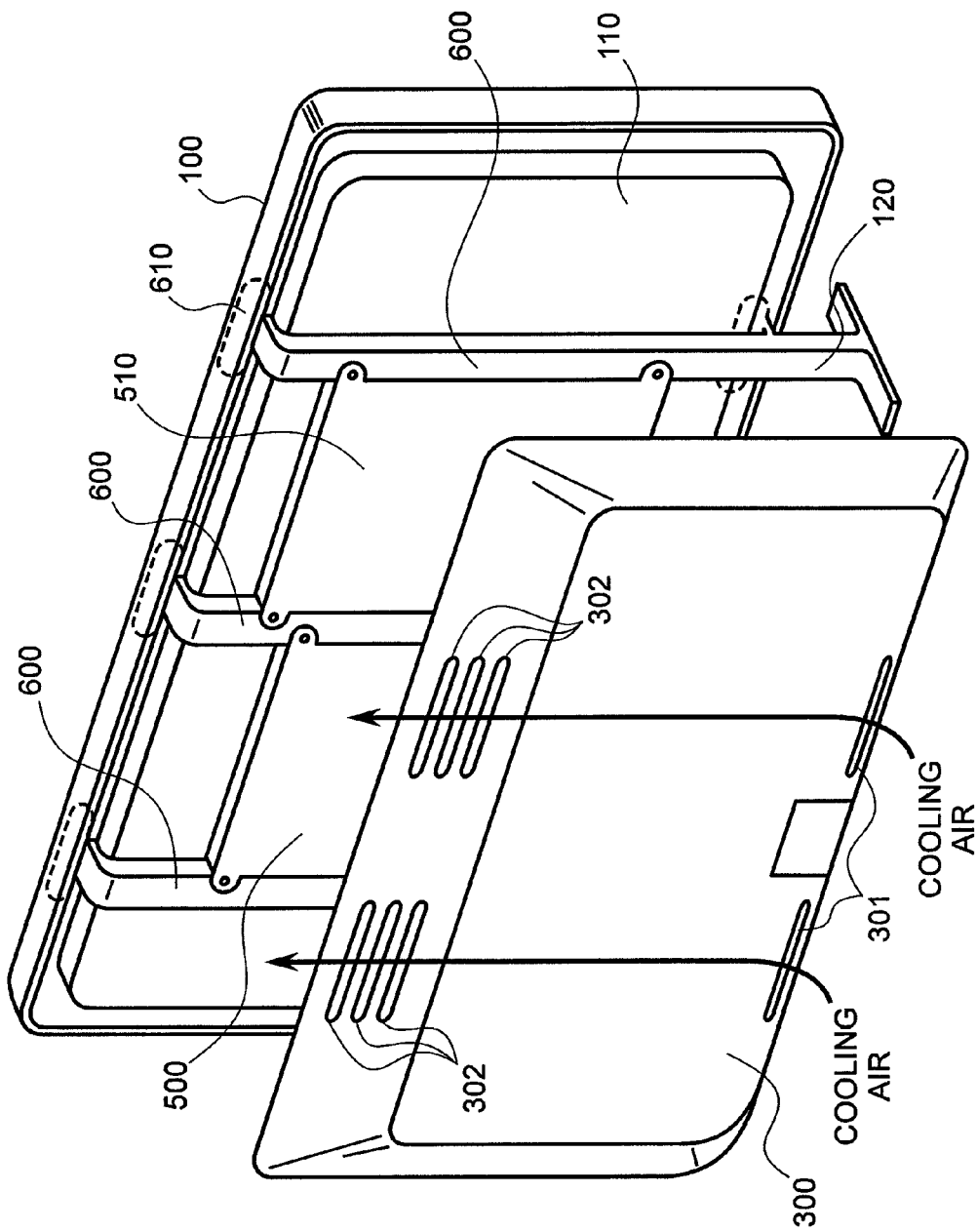
FIG. 7 is a view for showing the condition of attaching a reverse cover thereon, after attaching a circuit board onto the panel module mentioned above.

Lastly, FIG. 7 shows the state (or condition) where the rear cover 300 is attached on the reverse surface of the panel module, after attaching the circuit boards thereon, such as, the signal board and the power source board, etc., mentioned above, with using the plural pieces of the supporting members 600, 600 . . . , which are attached on the reverse side of the panel module, in the manner as was mentioned above. And, the signal board 500 and the power source board 510 are, as apparent from the structures thereof mentioned above, since they are attached while defining gaps between the frame 110, on the rear surface side of the panel module, as is shown by arrows in the figure, the airs flowing into an inside of the rear cover 300 through openings 301, which are formed in a lower portion thereof, pass through the gaps mentioned above and also in vicinity of the elements, and thereby moving upwards while cooling down the signal board 500 and/or the power source board 510. Thereafter, they flow out into an outside from openings 302, 302 . . . , which are formed in an upper portion of the rear cover 300.

Thus, with such the structures as was mentioned above, there can be resulted the following superior effects; i.e., the circuit boards or substrates, such as, the signal board 500 and/or the power source board 510, etc., can be disposed within the narrow space remaining on the reverse surface side of the panel module, with using the plural number of the supporting members, which are attached on the reverse side of the panel module, and also the cooling of those circuit boards can be ensured with certainty. Judging from this, the plural numbers of the supporting members 600, 600 . . . , which are mentioned above, are attached, aligning, preferably, into a flow of the airs cooling the signal board 500 and/or the power source board 510, i.e., in the vertical direction.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications that fall within the ambit of the appended claims.

What is claimed is:

1. A display apparatus, comprising:
   a display panel;
   a signal board configured for processing an image signal used in an image display; and
   a power source board configured for supplying power from a power source to said signal board and said display panel, wherein:
   said signal board and said power source board are disposed in a horizontal direction relative to said display panel, and
   a projection portion, being disposed higher above a surface of said power source board than a circuit element of said power source board and not being connected with a member opposing to a mounting side of said circuit element, is provided on the surface of said power source board where said circuit element is mounted.

2. The display apparatus according to claim 1, wherein said signal board and said power source board are arranged to be cooled, respectively, by air flowing from a lower side of said display apparatus.

3. The display apparatus according to claim 1, wherein, when a rear surface of said projection portion is pushed, the circuit element of said power source board is prevented from contacting the member positioned opposing to the mounting side of said circuit element by said projection portion.

4. The display apparatus according to claim 1, wherein the member opposing to the mounting side of said circuit element is a rear chasses of said display panel.

5. A display apparatus, comprising:
a display panel;
a signal board configured to process an image signal used in an image display;
a power source board configured to supply power to said signal board and said display panel; and
a projection portion configured to be provided on a mounting surface of said power source board where a circuit element of said power source board is mounted;
wherein said signal board and said power source board are disposed in a horizontal direction of said display panel, and
said projection portion is configured to be higher above said mounting surface of said power source board than said circuit element of said power source board and not to be connected with a member facing to said mounting surface of said power source board.

6. The display apparatus according to claim 5, wherein said signal board and said power source board are arranged to be cooled, respectively, by air flowing from a lower side of said display apparatus.

7. The display apparatus according to claim 5, wherein, when a rear side of said display apparatus is pushed, said projection portion prevents said circuit element of said power source board from contacting with the member positioned facing to said mounting surface.

8. The display apparatus according to claim 5, wherein the member facing to the mounting side of said circuit element is a rear chassis of said display panel.

9. A display apparatus, comprising:
a display panel;
a signal board configured to process an image signal used in an image display;
a power source board configured to supply power to said signal board and said display panel;
a projection portion which is provided on a mounting surface of said power source board where a circuit element of said power source board is mounted; and
a rear cover configured to cover a rear side of said display apparatus, wherein:
said signal board and said power source board are disposed in a horizontal direction of said display panel, and
said projection portion is configured to prevent contacting of said circuit element of said power source board with a member positioned facing to said mounting surface of said power source board, when said rear cover is pushed.

10. The display apparatus according to claim 9, wherein the member facing to the mounting side of said circuit element is a rear chassis of said display panel.

* * * * *